United States Patent [19]

Yano et al.

[11] Patent Number: 5,198,884
[45] Date of Patent: Mar. 30, 1993

[54] SEMICONDUCTOR DEVICES HAVING A DOUBLE-LAYER INTERCONNECTION STRUCTURE

[75] Inventors: Kohsaku Yano; Tetsuya Ueda; Teruhito Ohnishi; Hiroshi Nishimura, all of Osaka, Japan

[73] Assignee: Matsushita Electric Industrial Co., Ltd., Osaka, Japan

[21] Appl. No.: 675,833

[22] Filed: Mar. 27, 1991

[30] Foreign Application Priority Data

Mar. 27, 1990 [JP] Japan .................................. 2-77863

[51] Int. Cl.$^5$ ............................................ H01L 23/48
[52] U.S. Cl. .................................. 257/760; 257/633; 257/641
[58] Field of Search ........................ 357/65, 68, 69, 70, 357/71

[56] References Cited

U.S. PATENT DOCUMENTS 5,060,050 10/1991 Tsuneoka et al. .................... 357/71

OTHER PUBLICATIONS

"Effect of Stress in Passivation Layer on Electromigration Lifetime for Vias" by H. Nishimura et al.; VLSI Technology, 1990.
Solid State Technology, vol. 3, pp. 113–120, (1983) by P. B. Ghate.
"Reliability Implications of Nitrogen Contamination During Deposition of Sputtered Aluminum/Silicon Metal Films", by J. Klema e al.; The 22nd Annual Proceeding International Reliability Physics Symposium, pp. 1–5 (1984).
"A New Reliability Problem Associated with Ar Ion Sputter Cleaning of Inerconnect Vias", by H. Tomioka et al.; The 17th Annual Proceeding International Reliability Physics Symposium, pp. 53–58 (1989).

Primary Examiner—Frank Gonzalez
Attorney, Agent, or Firm—Lowe, Price, LeBlanc & Becker

[57] ABSTRACT

A semiconductor device having a double-layer interconnection with contact portions between first and second metal films covered with at least a silicon nitride film is provided wherein an electromigration characteristic at the contact portions is improved. The improvement is achieved by defining a value obtained by multiplying a thickness of the silicon nitride film by a stress of the nitride film formed at the contact portions is not larger than 2/5 of a value obtained by multiplying a thickness of the silicon nitride film by a stress of the nitride film formed at non-contact portions. By this, the stress exerted on the second metal film is reduced to improve the electromigration life at the contact portions by about one order of magnitude. The first and second metal films are made of Al or Al-based alloys.

7 Claims, 8 Drawing Sheets

SEMICONDUCTOR DEVICES HAVING A DOUBLE-LAYER INTERCONNECTION STRUCTURE

BACKGROUND OF THE INVENTION

1. Field of The Invention

This invention relates to electronic devices and more particularly, to semiconductor devices having a super LSI multilayer interconnection structure.

2. Description of The Prior Art

As is known in the art, the high degree of integration of super large scale integration circuits invariably requires multilayer or multilevel interconnections where the interconnection structure has two or more layers built up therein. Semiconductor devices having such an interconnection structure include a protective layer for preventing moisture and/or impurities from entering. This protective layer is to cover the multilayer interconnection therewith and has usually a structure which includes a phosphosilicate glass layer (P-containing $SiO_2$) and a silicon nitride film formed by plasma-enhanced CVD. A typical example of a two-layer wiring structure is illustrated with reference to FIG. 9. In the figure, there is generally shown a semiconductor device S which includes a substrate 20 having a transistor region (not shown) covered with an insulating film 21 having an opening 21a. A first metal film 22 serving as a first wiring is formed on the substrate 20 as shown. Moreover, an insulating film 23 having an opening 23a is formed over the first metal film 22 and a second metal film 24 serving as a second wiring is provided on the insulating film 23. The second metal film 24 is in contact, as C, with the first metal film 22 through the opening 23a. Finally, a protective layer 25 having a double-layered structure of a phosphosilicate glass layer and a silicon nitride layer (both not shown) is formed to cover the entire surface of the semiconductor device, thereby completing a two-layer interconnection. This interconnection structure is fundamentally composed of three lines including a line of the first wiring 22, a line of the second wiring 24 and the contact portion C where the first wiring 22 and the second wiring 24 are electrically contacted.

The degree of integration of large scale integrated circuits becomes higher with a finer size of the metal films or wirings. When an electric current is applied to such a circuit, there will arise the problem that the breakage of the fine wiring takes place. This is called electromigration (which may be hereinafter referred to often as EM) failure. This EM failure takes place due to the fact that Al atoms ordinarily used as the metal film are moved along the passage direction of electrons generated by application of the current and a portion of the film where the movement is violent is broken. To avoid this, it has been proposed that elements other than Al, e.g. Cu, Ti and the like, are added to the Al film so that the number of vacancies present in Al grain boundaries are decreased to reduce the movement of Al atoms (P. B. Gate, Solid State Technology, Vol. 3, pp. 113–120, (1983)).

Another problem involved in the fine wiring of the super large scale integrated circuits is a phenomenon where when kept merely at high temperatures, the wiring is broken. This is called stress migration (which may be often referred to as SM). With regard to the SM phenomenon, it has been reported that the breakage frequently takes place when the circuit is maintained at a temperature of approximately 150° C. This will be overcome to an extent by addition of Cu or the like element (J. Kelma et al, The 22nd Annual Proceeding International Reliability Physics Symposium, pp. 1–5 (1984)).

The above two reports have been made to solve the problems on the single-layer wiring line. With LSI circuits including a double-layer or multilayer interconnection structure, the problems involved in the EM and SM phenomena at contact portions between the interconnected wirings have to be solved, like the single-layer wiring line.

Few reports have been made on the EM and SM phenomena at the contact portion. It is empirically assumed that the EM and SM characteristics will be improved by tapering the insulating film at the contact portion to improve the aluminium coverage of the second wiring. This tapered technique has now been in use. However, it has been reported that this technique has the following disadvantage (H. Tomioka et al, The 27th Annual Proceeding International Reliablility Physics Symposium, p. 57 (1989)). The second aluminium film is usually formed by sputtering at relatively high sputtering power. In this condition, when the contact portion is tapered, the substrate made generally of $SiO_2$ is apt to be sputtered at the tapered contact portion as well. This results in $SiO_2$ formed between the first and second aluminium films, thereby causing the EM characteristics to be degraded. Thus, care should be paid to the formation of $SiO_2$ at the contact interface.

The status of the double-layer wiring arrangements can be summarized in the following table.

TABLE

| | Prior Art | Measure for Solving EM Problem | Possibility for Application to Semiconductor Device |
|---|---|---|---|
| EM Phenomenon | | | |
| first metal film | several reports | *improved by addition of impurity elements<br>*improved by increasing grains of Al | possible to use in 1.2 μm line width |
| second metal film | several reports | *improved by addition of impurity elements<br>*improved by increasing grains of Al | possible to use in 1.2 μm line width |
| contact portion | few reports | *because of poor coverage of the second metal film at the contact portion, the portion is tapered but with a problem that SiO2 is formed at the interface between the first and second metal film | difficult to use in a size of 1.2 μm square |
| SM Phenomenon | | | |
| first metal film | several reports | improved by addition of impurity elements | possible to use in 1.2 μm line width |
| second metal film | several reports | improved by addition of impurity elements | possible to use in 1.2 μm line width |
| contact portion | few reports | *because of poor coverage of the second metal film, the portion is tapered, which is now under study | not known |

As will be apparent from the above table, although EM and SM characteristics of the first and second metal films and the problems involved in the contact portion have been individually reported, we have not found any attempt to match the respective films and the contact portion when the double-layer wiring structure is applied to semiconductor devices.

SUMMARY OF THE INVENTION

It is accordingly an object of the invention to provide a semiconductor device having a double-layer interconnection structure with improved electromigration and stress migration characteristics wherein the respective metal films and a contact portion of the films are so matched as to improve the electromigration characteristics, particularly, of the contact portion.

It is another object of the invention to provide a semiconductor device having a double-layer interconnection structure wherein a metal film covered with a protective layer and formed at a contact portion of first and second metal films is reduced in stress from the protective layer.

It is a further object of the invention to provide a semiconductor device having a double-layer interconnection structure whose electromigration life is improved by one order of magnitude over known interconnection structure.

The above objects can be achieved, according to the invention, by a semiconductor device of the type which comprises a first metal film formed on a semiconductor substrate, an insulating film having openings and formed on the first metal film, a second metal film provided in electric connection with the first metal film through the openings of the insulating film, and a protective layer made of a phosphosilicate glass film and a silicon nitride film formed on the second metal film in this order. In the semiconductor device, the improvement resides in that a value obtained by multiplying a thickness of the silicon nitride film formed on the second metal film layer at the openings by a stress of the silicon nitride film is not larger than 2/5 of a value of a thickness of the silicon nitride film formed on the second metal film on portions other than the openings by a stress of the silicon nitride film on the portions.

The openings may be tapered or not. If tapered, an angle of the taper is preferably in the range of not less than 75°.

The first and second metal films may be made of Al alone or Al alloys containing Si, Cu, Ti and/or Pd in amounts of up to 5 wt% in total.

BRIEF DESCRIPTION OF THE DRAWINGS

FIGS. 1a to 1c are, respectively, a semiconductor device according to an embodiment of the invention wherein FIG. 1a is a schematic sectional view of a contact chain portion used to measure EM life of a multilayer interconnection, FIG. 1b is a schematic sectional view of a first metal film or first wiring, and FIG. 1c is a schematic sectional view of a second metal film or second wiring;

FIGS. 3a to 3c are, respectively, graphical representations wherein FIG. 3a is a graph showing the relation between the coverage rate of aluminium and the angle of taper at a contact portion, FIG. 3b is a graph showing the relation between the thickness of a SiN protective film and the angle of taper at the contact portion, and FIG. 3c is a graph showing the relation between the average failure time and the angle of taper at the contact portion;

DETAILED DESCRIPTION AND EMBODIMENTS OF THE INVENTION

Figure 1A:
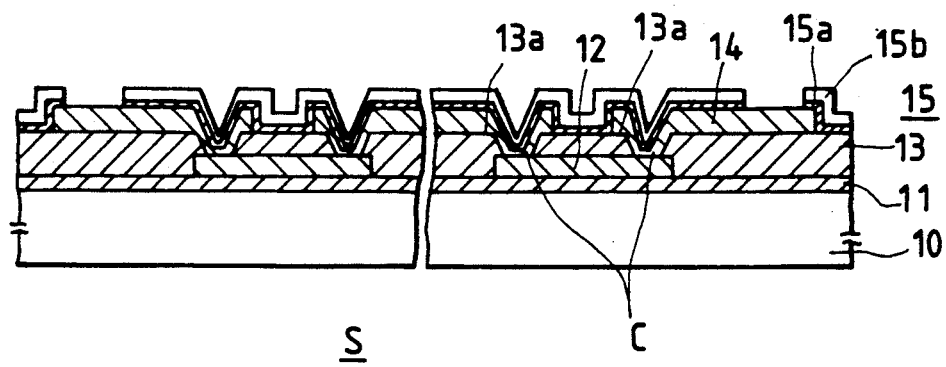

Initially, the reason why we attempted to improve the EM characteristic at contact portions between first and second metal films is described with reference to FIGS. 1 and 10 to 12 wherein like reference numerals indicate like parts.

The sizes of the first and second metal films and the contact portions usually employed in semiconductor devices are first described. For instance, when the width of the first metal film is set at a minimum level for microprocessors where a great load is applied to the metal film, e.g. 1.2 μm, the width of the second metal film is determined at a minimum level of 1.2 μm. The contact portion is determined to have a maximum size at a portion where the first and second metal films are crossed. The area of the contact portion becomes 1.2 micrometer square. This is particularly shown in FIG. 10. In the figure, the alignment margin extending from first and second metal films 12, 14 and provided around contact portions C is an allowance in anticipation of an alignment shear in lithography. Thus, the sizes of the first and second metal films 12, 14 and the contact portion C used to make a double-layer interconnection structure are determined such that the first and second metal films 12, 14 have the same width and the contact portion C is a quadrilateral with one side corresponding to the width.

Figure 10:
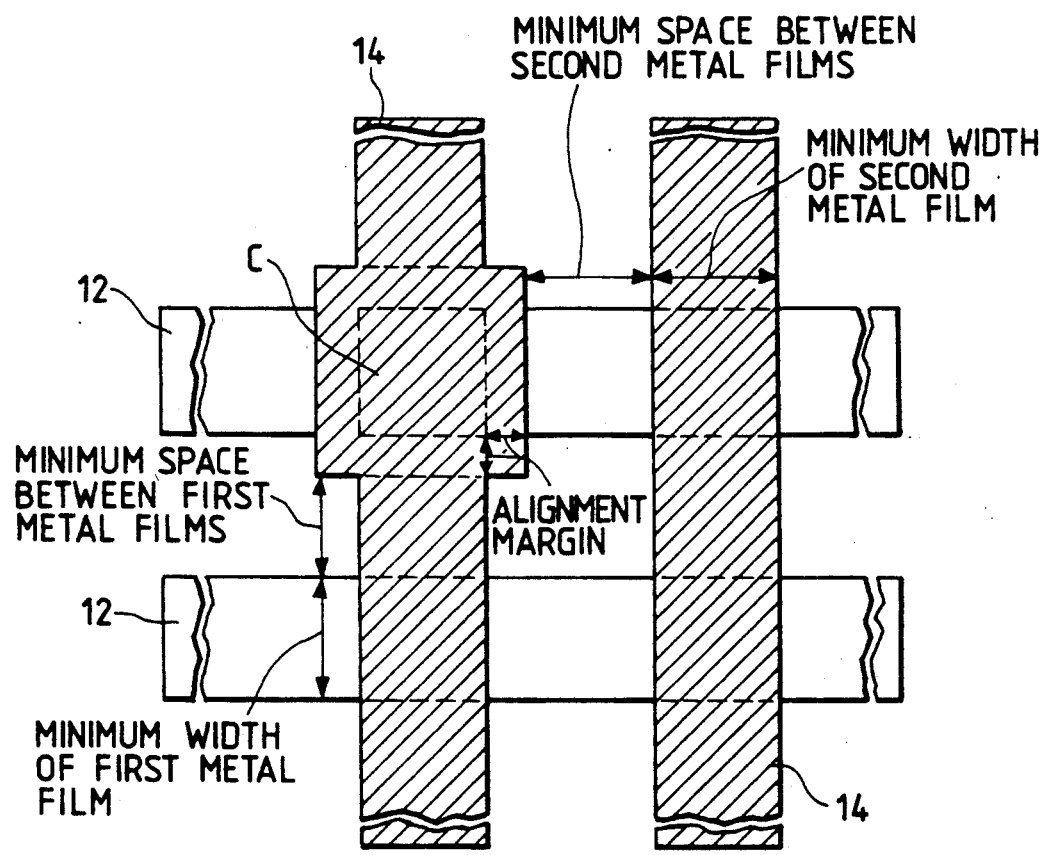
FIG. 10 is a schematic plan view of a contact portion of a double-layer interconnection of a semiconductor device according to the invention.

The EM characteristic of the double-layer interconnection structure as shown in FIG. 10 is measured. The double-layer interconnection structure consists of the first and second metal films and the contact portion and the sections of these portions are shown particularly in FIGS. 1a to 1c. For the measurement, an aluminium alloy containing 1% of Si and 0.5% of Cu is used as the first and second metal films 12, 14. 400 contact portions C of the first and second metal films 12, 14 with 1.2 micrometer square are connected in series (hereinafter referred to as a contact chain) as shown in FIG. 1a. The device of FIG. 1a will be described in detail hereinafter.

Since a step coverage of the aluminium alloy by sputtering is relatively poor, each contact portion is tapered for convenience' sake at about 55° in a series of experiments made by us only for confirmation.

Figure 1B:
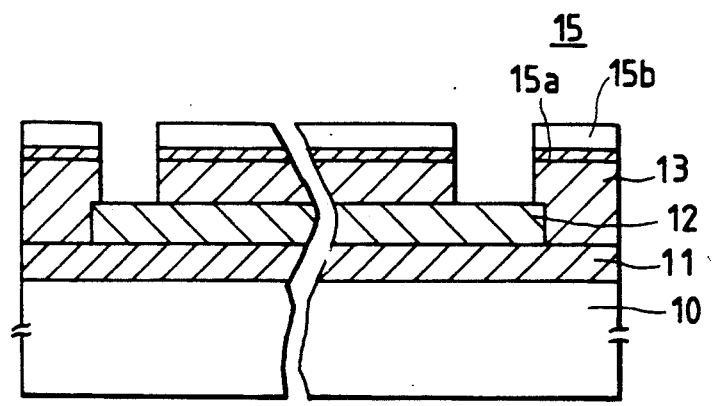
Figure 1C:
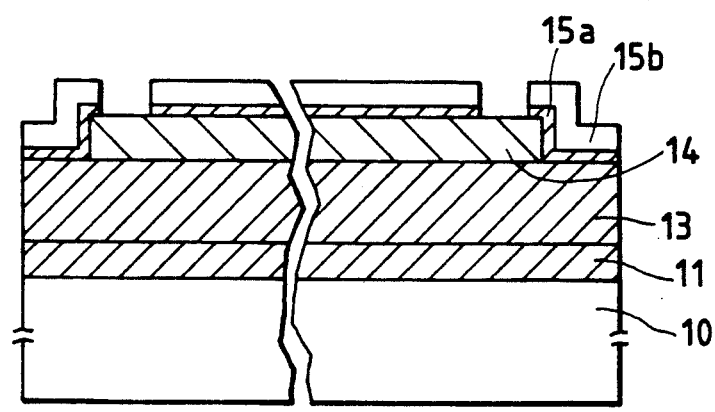

In addition to the double-layer interconnection shown in FIG. 1a, a wiring structure including the first metal film 12 having a width of 1.2 μm and a thickness of 0.8 μm is shown in FIG. 1b. Likewise, a wiring structure including the second metal film 14 having a width of 1.2 μm and a thickness of 1.0 μm is shown in FIG. 1c. The lives of the respective structures are determined by EM measurement.

The EM measurement is made in the following manner.

After determination of the sectional areas of the first and second metal films and the contact portions, the respective structures are kept at 150° C. and applied with an electric current with a current density of $2 \times 10^6$ A/cm$^2$ to determine a time before it fails. This is usually called EM measurement. It will be noted that the EM measurement is an acceleration test wherein a life test corresponding to 10 years is effected in about 100 hours. The upper limit of actual use conditions of LSI circuits include those conditions of a temperature of 80° C. and a DC current density of $1 \times 10^5$ A/cm$^2$ whereupon a pulse current is passed through a 1.2 μm square contact portion. The life of the interconnection structure is estimated by keeping a sample at 150° C. and applying a DC current with a current density of $2 \times 10^6$ A/cm$^2$. With the contact portion, when the time before it fails is over 12 hours, its actual service life corresponds to over 10 years. With the first and second films, the time over 50 hours corresponds to an actual service life of over 10 years.

Figure 11:
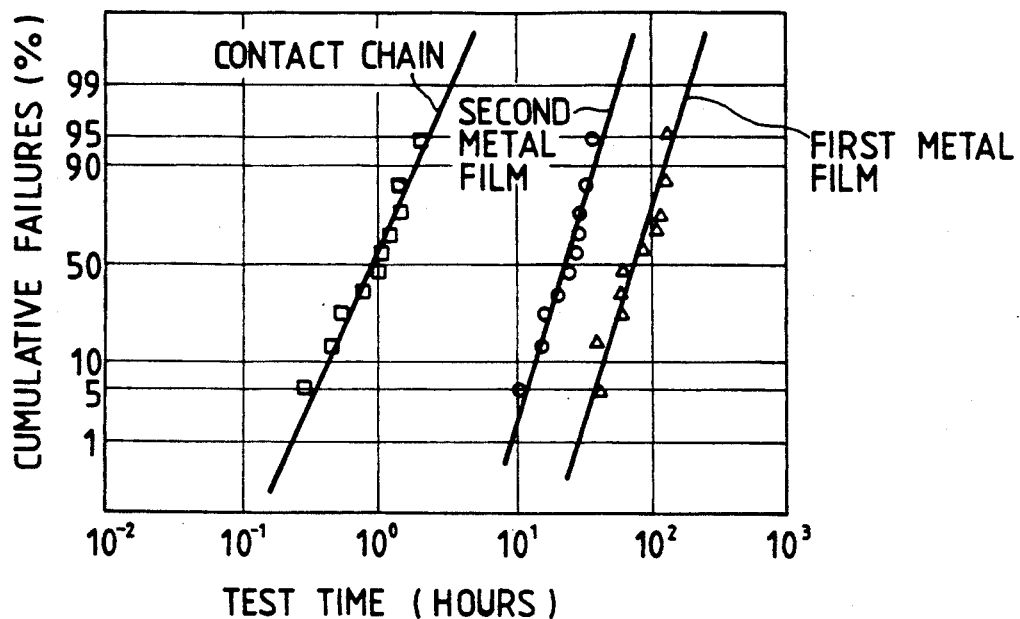
FIG. 11 is a graphical representation of the relation between the cumulative failure rate and the test time for illustrating an electromigration characteristic of a first metal film, a second metal film and a contact chain between the first and second metal films, respectively.

The results are shown in FIG. 11. As will be apparent from the figure, the contact chain is shorter in the time by one order of magnitude or over than the other parts.

It has been reported that the EM characteristic at the contact chain is degraded due to the presence of a thin SiO$_2$ layer at the contact portion between the first and second metal films. More particularly, when the second metal film is deposited by sputtering, SiO$_2$ at the tapered portion is sputtered by means of Ar ions and re-deposited on the first metal film exposed at the opening. To avoid this, the sputtering of the aluminium alloy for the second film is performed at a small power level so that SiO$_2$ is not sputtered.

The absence of SiO$_2$ at the interface has been confirmed as follows.

Figure 12:
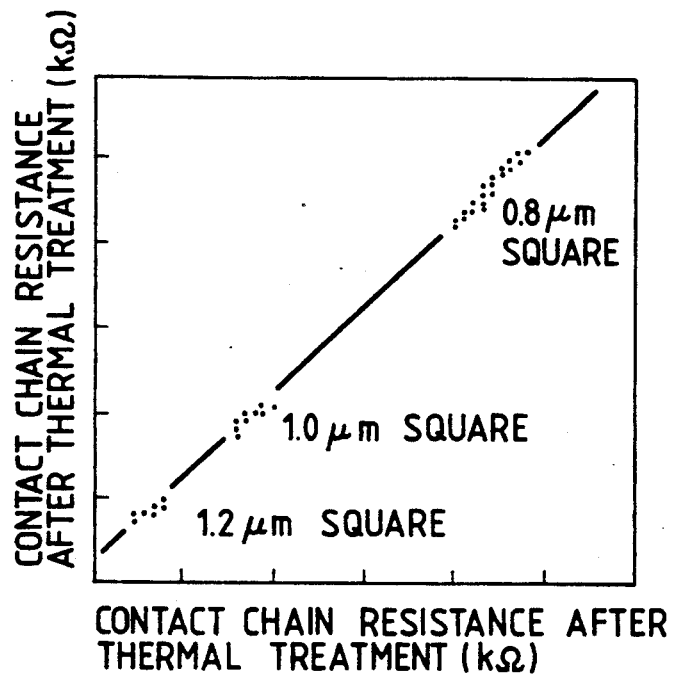
FIG. 12 is a graphical representation of the relation between the contact chain resistance after thermal treatment and the contact chain resistance prior to the thermal treatment.

If a thin SiO$_2$ film is present at the interface, the contact chain resistance after fabrication of the double-layer interconnection structure scatters greatly and its value is greatly varied when the structure is subjected to thermal treatment at about 400° C. A chain of 10000 contact portions with a taper angle of 55° is subjected to thermal treatment at 450° C. for 150 minutes to measure a resistance of the contact chain. In this measurement, the contact size is 0.8 μm, 1.0 μm, and 1.2 μm square. 108 samples for each contact size are used for the measurement. The variation of the resistance prior to and after the thermal treatment is shown in FIG. 12.

As will be seen from the figure, the resistance is scattered to an extent for the contact size of 0.8 μm but a significant variation in the resistance is not found prior to and after the thermal treatment for the other sizes. This means that SiO$_2$ is not present at the contact portion. For further confirmation from a physical aspect, the section of the 1.2 μm contact portion has been subjected to observation through a transmission electron microscope, with the result that no SiO$_2$ is found. The aluminium has been found to be alloyed at the contact portion.

In view of the above results, we made further studies to solve the problem that the EM characteristic at the contact portions between the first and second metal films is poor irrespective of the absence of SiO$_2$ at the interface and thus to provide a semiconductor device with an improved EM characteristic at the contact portions of the double-layer interconnection.

Reference is now made to the accompanying drawings and particularly, to FIGS. 1a to 1c.

In FIG. 1a, there is shown a semiconductor device S which includes a semiconductor substrate 10 having a SiO$_2$ film 11 thereon, a first metal film or wiring 12 formed on the SiO$_2$ film 11. An insulating film 13 having openings 13a is formed on the first metal film 12, on which a second metal film or wiring 14 is formed as connected with the first metal film 12 through each opening 13a at a contact portion C with an area of about 1.2 micrometer square. Further, a protective film 15 consisting of a phosphosilicate glass film 15a and an SiN film 15b is formed over the entire surface. The semiconductor substrate 10 has a semiconductor region (not shown) and the first and second metal films 12, 14 are made of aluminium containing 1% of Ti and 0.5% of Cu for the following tests although not limited to the Al alloy alone.

FIG. 1b is a schematic view of a single-layer structure including the first metal film 12. For instance, the first metal film 12 is 1.2 μm in width and 0.8 μm in thickness. Likewise, FIG. 1c is a schematic view of a single-layer structure including the second metal film 14 having, for example, a width of 1.2 μm and a thickness of 1.0 μm.

Figure 2:
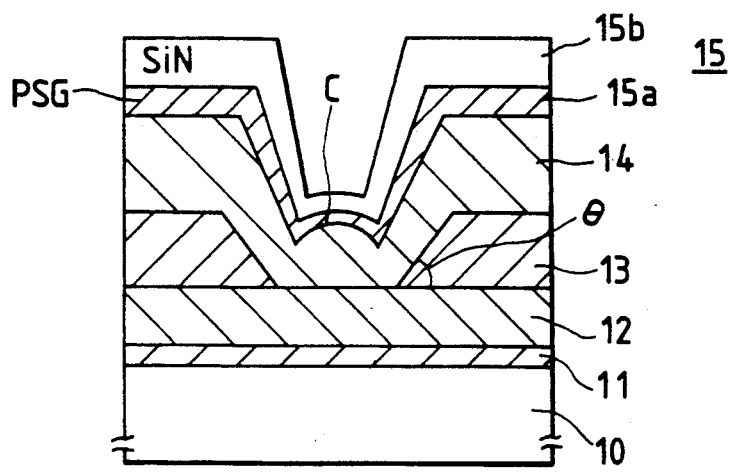
FIG. 2 is a schematic sectional view of a contact portion between the first metal film and the second metal film according to the invention.

In the present invention, the EM characteristic at the contact portion C as shown in FIG. 1a is improved. In order to clarify the influence of the SiN film 15b, a taper or inclination angle at the contact portions as shown in FIG. 2 is changed. Then, the average failure time of the resulting semiconductor device is checked in relation to the coverage rate of the second aluminium layer and the thickness of the SiN film.

The coverage rate of the aluminium layer and the thickness of the SiN layer are determined through observation of a section of the contact portion with a scanning-type electron microscope. Further, samples with different coverage rates of the Al layer are provided wherein 500 contact portions are connected in series in each sample. The same level of electric current is applied to all the samples in such a way that the current density is set at $2 \times 10^6$ A/cm$^2$ at a minimum aluminium sectional area of the contact portion of each sample with a taper angle of 85° to measure an EM value, thereby determining an average failure time. It will be noted that the average failure time is one at which a cumulative failure reaches 50% when the EM value is measured as shown in FIG. 11. The results of the above measurement are shown in FIGS. 3a to 3c.

Figure 3A:
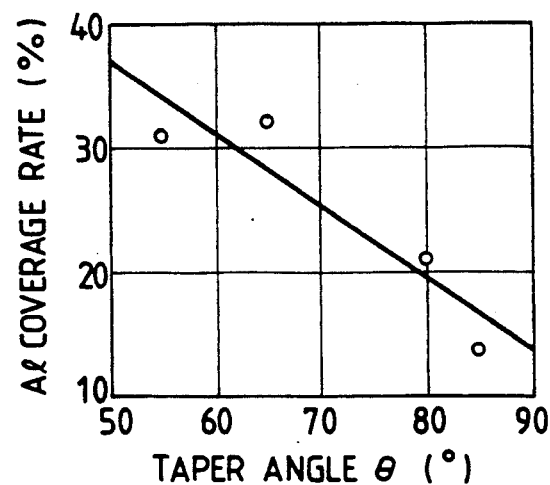
Figure 3B:
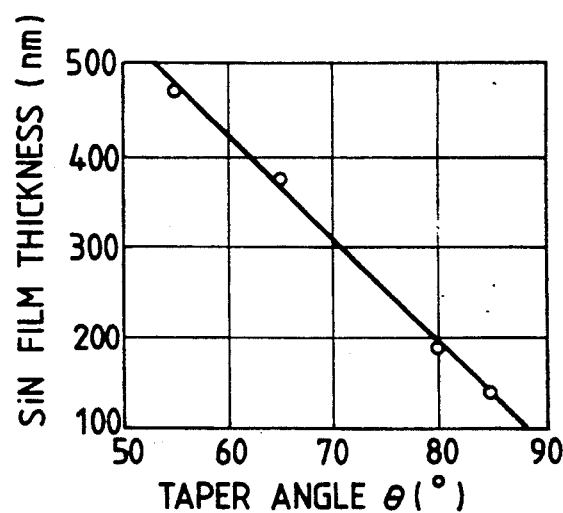
Figure 3C:
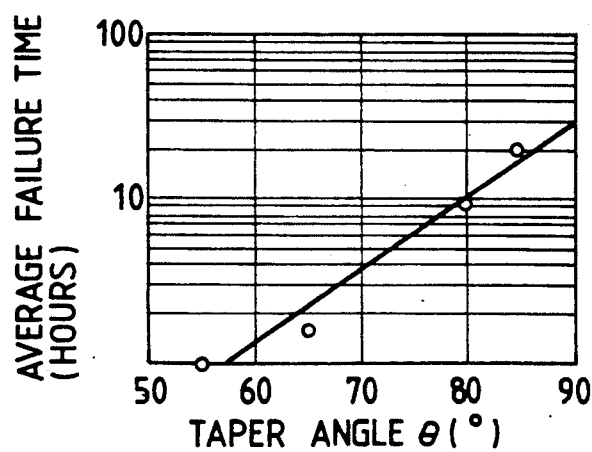

As will be seen from FIG. 3a, a higher taper angle, θ, at the contact portion results in a lower coverage rate of the aluminium layer. Similarly, FIG. 3b reveals that a higher angle results in a lower thickness of the SiN film. In contrast, the average failure time increases with an increase of the angle, $\theta$, as is seen from FIG. 3c. In order to obtain the EM life of the contact chain at the same level as the EM life of the second aluminium film, the taper angle at the contact portion should preferably be in the range of not less than 75°, more preferably not less than 80°. It will be noted that in the practice of the invention, it is not necessarily intended to define the taper angle at the contact portion, but physical factors which contribute to limit the EM life of the contact chain are important. In view of the coverage rate of the aluminium layer, the results of FIG. 3 are contrary to the generally accepted assumption that an increase of the current density leads to degradation of the EM characteristic. Accordingly, the influence of the SiN film has been investigated in the following manner.

Figure 4:
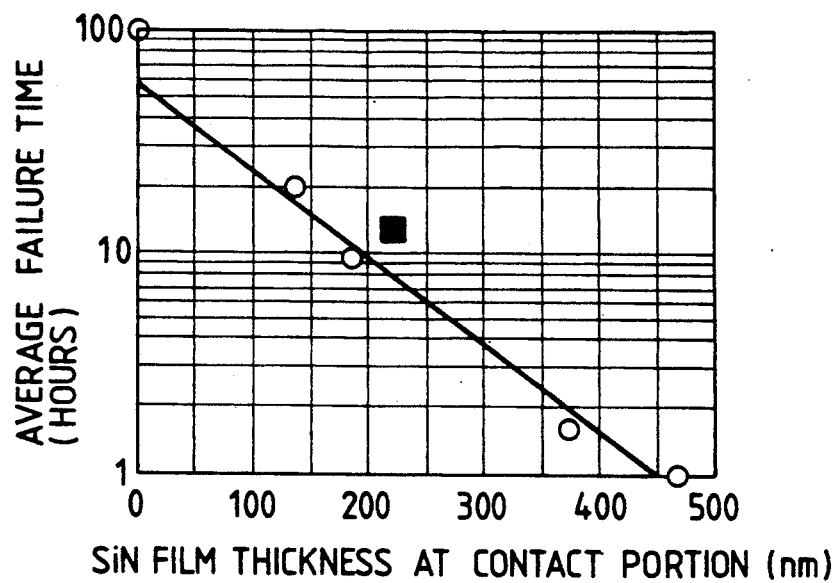
FIG. 4 is a graphical representation of the relation between the thickness of a SiN protective film and the average failure time.

There are fabricated double-layer interconnection structures of the type as shown in FIG. 2 where any SiN film is not formed in one case, SiN films are formed with different thicknesses at the same stress level, and a SiN film is formed whose quantity of stress is reduced to ½ of the above-mentioned SiN films. In all cases, the taper angle is set at 85°. The EM characteristic of each structure is measured to determine an average failure time. The results are shown in FIG. 4. In the figure, the mark "○" is for the SiN films with the same level of stress. In this case, it will be found that the average failure time increases with a decrease of the SiN film thickness. In the absence of the SiN film, the average failure time is over 100 hours and is thus significantly improved with respect to the EM life. This means that the EM life of the contact chain has close relation with the SiN film. The mark "■" in the figure is for the SiN film whose stress is half the stress of the SiN films indicated by the mark "○". From the results of FIG. 4, it will be seen that the EM characteristic at the contact portion is dependent not only on the thickness of the SiN film, but also on the stress of the SiN film. Thus, the EM life of the double-layer interconnection structure at the contact portion is greatly influenced by the thickness and the stress of the protective SiN layer. A smaller thickness results in a better EM characteristic and a smaller stress results in a better EM characteristic. The EM characteristic at the contact portion depends similarly on the thickness and the stress of the SiN film. This is because a degree of deformation of aluminium such as warpage, compression or the like is expressed by a value obtained by multiplying the thickness of SiN film by the stress (dynes/cm$^2$). This value will be hereinafter referred to as total stress.

Figure 5:
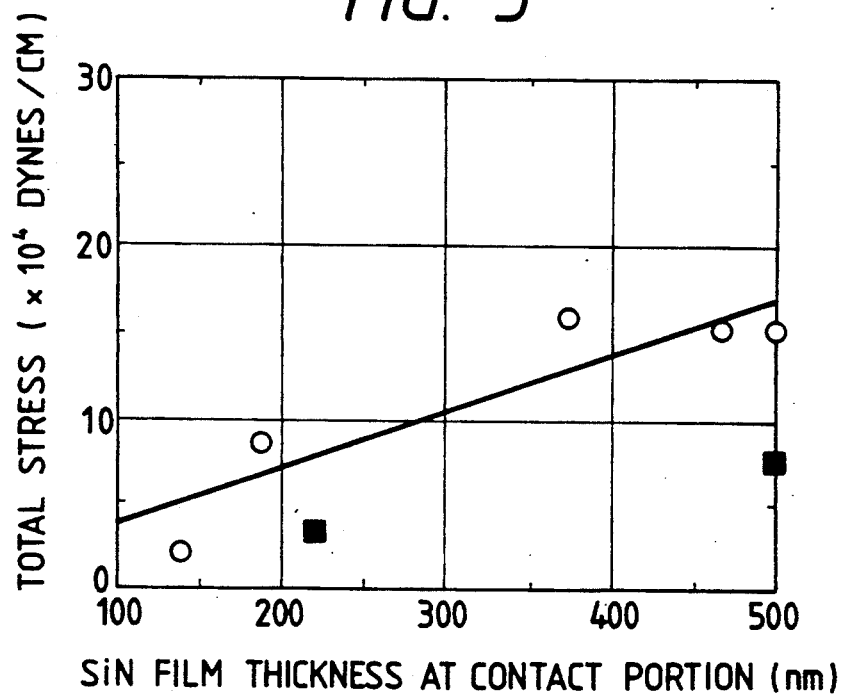
FIG. 5 is a graphical representation of the relation between the total stress and the thickness of a SiN protective film.

In order to numerically express the above relationship, the stress is measured for different thickness of the SiN films by the use of the AUTOSORT MARK II 150 instrument, available from GCA Corporation. The stress of the SiN film at the contact portion is measured by depositing on a Si substrate by plasma-enhanced CVD a SiN film with the same thickness as the SiN film thickness at the contact portion determined by the SEM technique as in FIG. 3b. It will be noted that although the protective layer includes the PSG film, the stress of the PSG film is approximately 10$^8$ dynes/cm$^2$ and is negligible. The relation between the SiN film thickness and the stress is shown in FIG. 5. The film quality is changed by changing the deposition conditions of the plasma-enhanced CVD. In the figure, the mark "○" indicates a 50 nm thick SiN film having a stress of $3 \times 10^9$ dynes/cm$^2$ and the mark "■" indicates a 50 nm thick SiN film having a stress of $5 \times 10^9$ dynes/cm$^2$. These films are subject to measurement of the EM characteristic.

Figure 6:
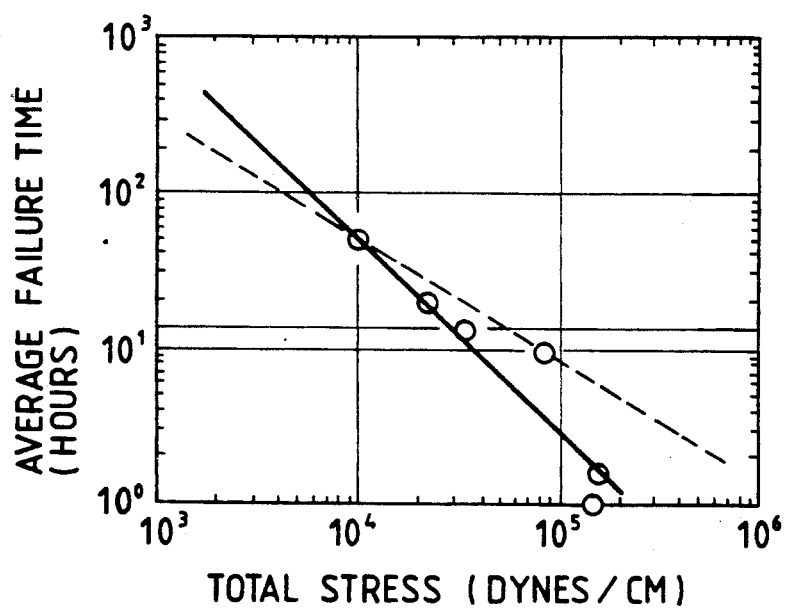
FIG. 6 is a graphical representation of the relation between the average failure time and the total stress.

The relation between the measured total stress and the average failure time obtained from the EM value is shown in FIG. 6. As will be apparent from the figure, the life of the Al wiring at the contact portion is inversely proportional to the total stress. In order to improve the EM life by one order of magnitude for the reason set out hereinlater using the protective layer having such a stress as mentioned above, consideration should be made to scatterings in measurement of the stress, the SiN film thickness and the life at the contact portion.

This is more particularly explained with regard to FIG. 6. The SiN film thickness deposited on the second Al film is 500 nm and the total stress at the second Al film is approximately $1.5 \times 10^5$ dynes/cm. The relationship between the total stress at the contact portion and the average failure time may be represented by the solid line in the figure. However, when the scattering of the measurement is taken into account, the relationship will be expressed by the broken line. In addition, the average failure time or the EM life of the second Al wiring is in the range of 10 to 20 hours as shown in the figure. In order to prolong the EM life at the contact chain substantially at the same level as that of the second wiring or to improve the life by one order of magnitude over that of a prior art counterpart, the total stress has to be not larger than approximately $6 \times 10^4$ dynes/cm at the contact portion. This value corresponds to about 2/5 of the total stress of the SiN film formed on the second wiring at portions other than the contact portion. More particularly, the total stress of the SiN film formed on the second wiring in the opening should be not larger than 2/5 of the total stress of the SiN film formed on the second wiring at portions other than the opening.

Figure 7A:
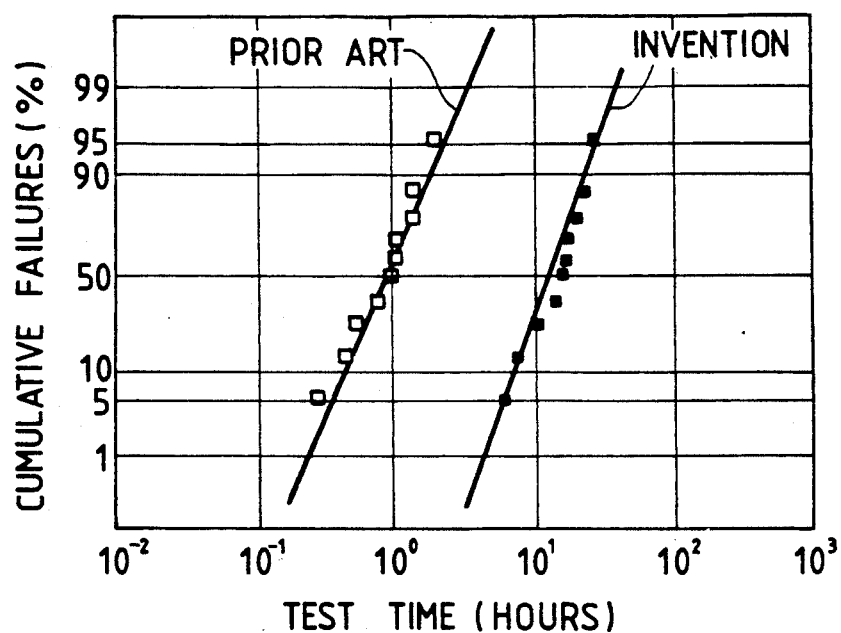
FIG. 7a is a graphical representation of the relation between the cumulative failure rate and the test time for semiconductor devices of the invention and for comparison.

The EM characteristic of a prior art double-layer interconnection structure having a contact portion with an area of 1.2 micrometer square and a double-layer interconnection structure of the invention having the same area of the contact portion as mentioned above where the total stress is not larger than 2/5 of the total stress of the protective film on a non-contact area of the Al film or wiring is shown in FIG. 7a. From this, it will be seen that the EM characteristic of the invention is improved by not less than one order of magnitude over that of the prior art.

Figure 7B:
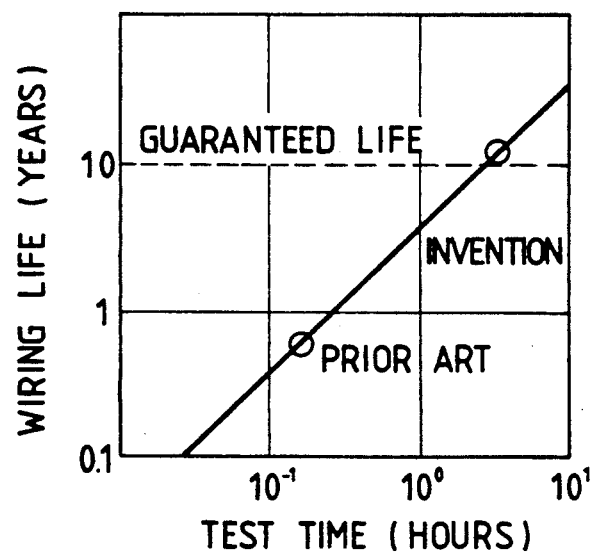
FIG. 7b is a graphical representation of the relation between the wiring life and the test time.

The reason why the EM life has to be improved by approximately one order of magnitude is ascribed to the guaranteed life of semiconductor products. The life of LSI semiconductor products is generally determined by the current density and the use temperature, under which it is guaranteed over approximately ten years. The measurement of the EM characteristic is made under accelerating conditions. To this end, the EM measuring conditions in this test include a temperature of 150° C. and current density of $2 \times 10^6$ A/cm$^2$. The actual use conditions include a temperature of 80° C. and a current density of $1 \times 10^5$ A/cm$^2$ for substantially all types of products except for specific applications. The cumulative failure of about 0.3% in FIG. 7a corresponds to 2.83 test hours, which in turn corresponds to a life of the metal film wirings of ten years under actual use conditions. This relationship is shown in FIG. 7b, revealing that the guaranteed life of ten years can be achieved according to the invention.

In the foregoing, the aluminium film or wiring containing Si and Cu has been described. Pure Al with or without Si, Ti and/or Pd may be likewise used as the film with similar EM characteristic-improving effect.

Figure 8:
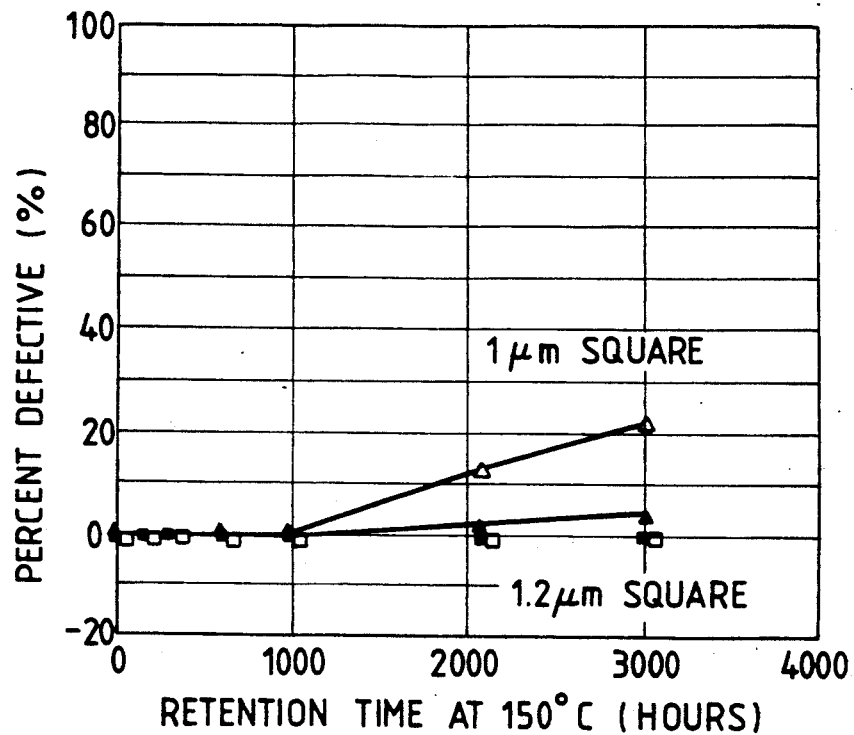
FIG. 8 is a graphical representation of the relation between the percent defective and the retention time at 150° C. for a stress migration characteristic of a contact chain.
Figure 9:
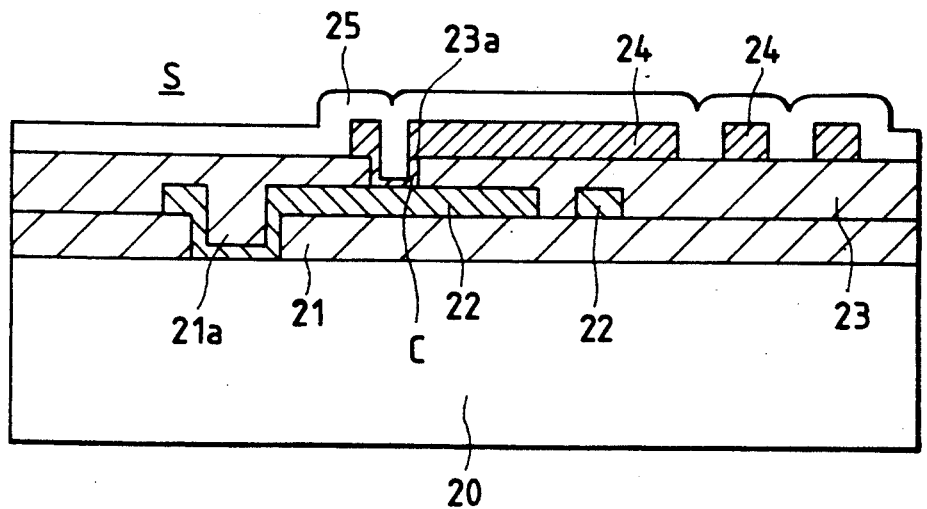
FIG. 9 is an illustrative sectional view of a double-layer interconnection in a known semiconductor device.

Then, a stress migration characteristic which is another factor for determining the film life is described. 400 contact chains formed thereover with a protective layer made of a 300 nm thick PSG film and a 500 nm thick SiN film are connected in series and have taper angle of 55° for comparison and 85° used in the present invention. The sample is maintained at 150° C. to determined a percent defective of film breakage in relation to the time. The results are shown in FIG. 8. In the figure, the mark "△" indicates a prior art case where the contact size is 1.0 micrometer square, the mark "▲" indicates a prior art case where the contact size is 1.2 micrometer square, the mark "□" indicates a case of the invention where the contact size is 1.0 micrometer square, and the mark "■" indicates a case of the invention where the contact size is 1.2 micrometer square. No percent defective takes place up to a time of 1000 hours in both the prior art and the invention. At 2100 hours for the 1.0 micrometer square contact portion, percent defective takes place in both the prior art and the invention. However, any problem will not be involved in the semiconductor products when the time of 1000 hours is ensured. Since the breakage failure takes place at 2100 hours both in the prior art and the invention with a difference therebetween, the SiN film at the contact portion is not considered to significantly influence the stress migration.

As will be apparent from the foregoing, the stress of the SiN film and the thickness of the SiN film at the contact portion are properly controlled so that the value obtained by multifying the thickness of the silicon nitride formed on the second metal film at the contact portion is not larger than 2/5 of the value obtained by multifying the thickness of the silicon nitride formed on the second metal film at the non-contact portion by the stress of the silicon nitride at the non-contact portion. By this, the stress exterted on the second metal film can be suppressed to a low level. The electromigration life of the contact portion can be improved by about one order of magnitude. The SiN film is usually formed in a thickness of from 300 to 1500 nm on portions of the second metal film other than in openings. In openings, the thickness is in the range of from 120 to 600 nm.

What is claimed is:

1. In a semiconductor device of the type which comprises a first metal film formed on a semiconductor substrate, an insulating film having openings and formed on the first metal film, a second metal film provided in electric contact with the first metal film through the openings of the insulating film, and a protective layer made of a phosphosilicate glass film and silicon nitride film formed on the second metal film, the improvement in that a value obtained by multiplying a thickness of the silicon nitride film formed on the second metal film layer at the openings by a stress of the film is not larger than 2/5 of a value of a thickness of the silicon nitride film formed on the second metal film on portions other than the openings by a stress of the silicon nitride film on the portions.

2. The semiconductor device according to claim 1, wherein the first-mentioned value is not less than $6 \times 10^4$ dynes/cm.

3. The semiconductor device according to claim 1, wherein the openings are each tapered.

4. The semiconductor device according to claim 1, wherein the first and second metal films are each made of a metal selected from the group consisting of Al and Al alloys containing at least one alloying element selected from Si, Ti, Pd and Cu.

5. The semiconductor device according to claim 4, wherein the metal is Al.

6. The semiconductor device according to claim 4, wherein the metal is an Al alloy containing the at least one alloying element.

7. The semiconductor device according to claim 6, wherein the content of alloying element in the alloy ranges up to 5 wt %.

* * * * *